(12) United States Patent
Briere et al.

(10) Patent No.: US 9,076,853 B2
(45) Date of Patent: Jul. 7, 2015

(54) HIGH VOLTAGE RECTIFIER AND SWITCHING CIRCUITS

(75) Inventors: Michael A. Briere, Scottsdale, AZ (US); Naresh Thapar, San Diego, CA (US)

(73) Assignee: International Rectifie Corporation, El Segundo, CA (US)

( * ) Notice: Subject to any disclaimer, the term of this patent is extended or adjusted under 35 U.S.C. 154(b) by 483 days.

(21) Appl. No.: 13/288,500

(22) Filed: Nov. 3, 2011

(65) Prior Publication Data

US 2012/0235209 A1 Sep. 20, 2012

Related U.S. Application Data

(60) Provisional application No. 61/454,081, filed on Mar. 18, 2011.

(51) Int. Cl.

| | | |
|---|---|---|
| *H01L 21/00* | (2006.01) | |
| *H01L 29/778* | (2006.01) | |
| *H01L 27/06* | (2006.01) | |
| *H01L 29/423* | (2006.01) | |
| *H02M 7/10* | (2006.01) | |
| *H01L 29/20* | (2006.01) | |

(52) U.S. Cl.
CPC ........ *H01L 29/7786* (2013.01); *H01L 27/0605* (2013.01); *H01L 27/0629* (2013.01); *H01L 29/2003* (2013.01); *H01L 29/42364* (2013.01); *H02M 7/106* (2013.01)

(58) Field of Classification Search
CPC ............ H01L 29/7786; H01L 29/42364; H01L 27/0605; H01L 29/2003; H01L 27/0629; H02M 7/106
USPC .......................... 257/335, 355, 194
See application file for complete search history.

(56) References Cited

U.S. PATENT DOCUMENTS

| | | | |
|---|---|---|---|
| 8,076,699 B2 * | 12/2011 | Chen et al. ............... | 257/194 |
| 8,116,120 B2 * | 2/2012 | Lin ........................... | 365/154 |
| 2012/0085892 A1 * | 4/2012 | Hirose ...................... | 250/214.1 |

* cited by examiner

*Primary Examiner* — Laura Menz
(74) *Attorney, Agent, or Firm* — Farjami & Farjami LLP

(57) ABSTRACT

According to one exemplary embodiment, a rectifier circuit includes a diode. A first depletion-mode transistor is connected to a cathode of the diode. Also, at least one second depletion-mode transistor is in parallel with the first depletion-mode transistor and is configured to supply a pre-determined current range to a cathode of the diode. A pinch off voltage of the at least one second depletion-mode transistor can be more negative than a pinch off voltage of the first depletion-mode transistor and the at least one second depletion-mode transistor can be configured to supply the pre-determined current range while the first depletion-mode transistor is OFF. Also, the pre-determined current range can be greater than a leakage current of the first depletion-mode transistor.

18 Claims, 4 Drawing Sheets

HIGH VOLTAGE RECTIFIER AND SWITCHING CIRCUITS

The present application claims the benefit of and priority to a pending provisional application entitled "Improved High Voltage Rectifier and Switching Circuits," Ser. No. 61/454,081 filed on Mar. 18, 2011. The disclosure in that pending provisional application is hereby incorporated fully by reference into the present application.

BACKGROUND OF THE INVENTION

1. Field of the Invention

The present invention is generally in the field of high voltage circuits. More particularly, the invention is in the field of high voltage rectifier and switching circuits.

2. Background Art

A depletion-mode transistor can be connected in cascode with an enhancement-mode transistor to form an enhancement-mode switching circuit. The enhancement-mode switching circuit can have a high voltage, such as 600 volts, connected to a drain of the depletion-mode transistor and a low voltage, such as −10 volts, present at the gate of the depletion-mode transistor and at the source of the enhancement-mode transistor. Using such a configuration, the gate of the enhancement-mode transistor can be a control terminal of the enhancement-mode switching circuit, while the blocking voltage of the depletion-mode transistor can provide the blocking capability of the switching circuit.

The depletion-mode transistor can be, for example, a high electron mobility transistor (HEMT), such as a III-Nitride HEMT, which can support high current and high blocking capability, but it may not be desirable to form as an III-Nitride enhancement-mode HEMT device. It may be preferred that the enhancement-mode transistor be, for example, a silicon transistor, such as a silicon field-effect transistor (FET), which can have low blocking capability and can be provided at a low cost. The switching circuit can advantageously operate similar to, for example, a 600 volt enhancement-mode HEMT.

The enhancement-mode switching circuit may include a diode connected in parallel with the enhancement-mode transistor, such that a cathode of the diode is connected for example to both the drain of the enhancement-mode transistor and the source of the depletion-mode transistor. For example, the enhancement-mode transistor can be a silicon transistor and the diode can be the body diode of the silicon transistor.

During operation of the switching circuit, a gate-source voltage of the depletion-mode transistor will adjust so as to attempt to supply the current required by the enhancement-mode transistor, or more particularly the current required by or drawn by the diode that is in parallel with the enhancement-mode transistor. The switching circuit can easily become unstable because the depletion-mode transistor can only support a very small leakage current when it is OFF. For example, due to the diode's leakage current, the gate-source voltage of the depletion-mode transistor will adjust toward the depletion-mode transistor's pinch off voltage (i.e. its threshold voltage). As the gate-source voltage approaches or surpasses the pinch off voltage, the electric filed applied to the gate of the depletion-mode transistor can become too large, thereby rupturing the gate of the depletion-mode transistor or otherwise damaging the switching circuit. Thus, the design of the switching circuit can be complicated as the diode may leak substantial current when at a high temperature, and in some designs may be a diode that easily leaks current, such as a Schottky diode.

When the parallel enhancement-mode transistor is not used, the resulting circuit is a rectifier circuit comprising a depletion-mode transistor in series with a diode. Such rectifier circuit suffers from similar disadvantages discussed above, and the design of this conventional rectifier circuit is also complicated since the diode may leak substantial current, and in some designs may be a diode that easily leaks current, such as a Schottky diode. The conventional rectifier circuit is thus susceptible to damage by the same mechanism discussed above.

Thus, there is a need in the art for switching and rectifier circuits that can overcome the drawbacks and deficiencies in the art.

SUMMARY OF THE INVENTION

Improved high voltage rectifier and switching circuits, substantially as shown in and/or described in connection with at least one of the figures, and as set forth more completely in the claims.

DETAILED DESCRIPTION OF THE INVENTION

The present invention is directed to improved high voltage rectifier and switching circuits. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

Figure 1A:
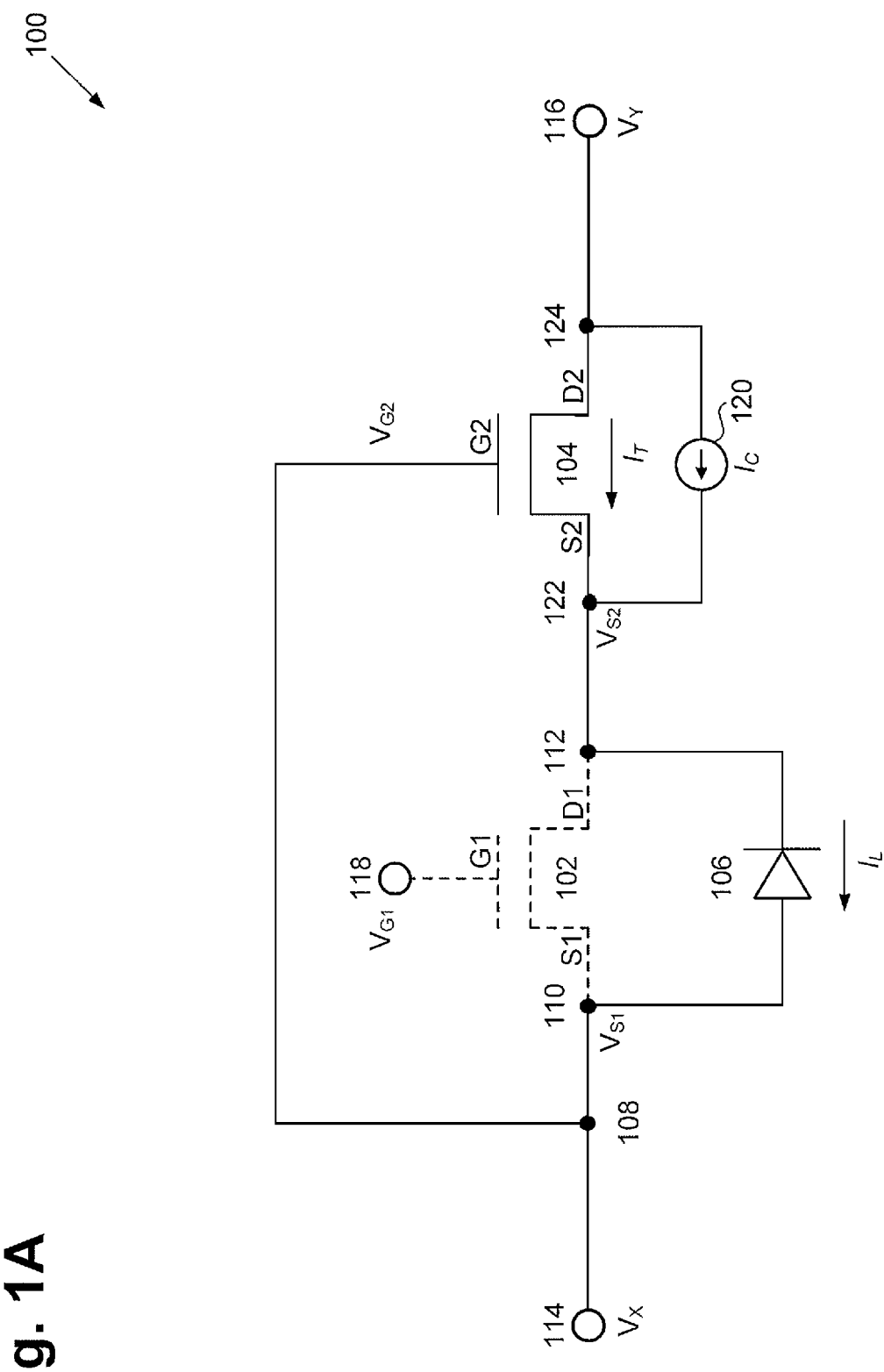
FIG. 1A illustrates a circuit diagram of an exemplary rectifier/switching circuit in accordance with one embodiment of the present invention.

The drawings in the present application and their accompanying detailed description are directed to merely exemplary embodiments of the invention. To maintain brevity, other embodiments of the present invention are not specifically described in the present application and are not specifically illustrated by the present drawings. FIG. 1A illustrates a circuit diagram of exemplary rectifier/switching circuit 100 (or referred to simply as a "switching circuit" or a "rectifier circuit") in accordance with one embodiment of the present invention. Rectifier/switching circuit 100 includes depletion-mode transistor 104, diode 106, and optionally enhancement-mode transistor 102.

In rectifier/switching circuit 100, source S2 of depletion-mode transistor 104 is connected to a cathode of diode 106 at node 112. Gate G2 of depletion-mode transistor 104 is connected to an anode of diode 106 at node 108. In some embodiments, rectifier/switching circuit 100 can include enhancement-mode transistor 102, which is optional as indicated by dashed lines in FIG. 1A. FIG. 1A shows depletion-mode transistor 104 is connected in cascade with enhancement-mode transistor 102, when optional enhancement-mode transistor 102 is used. As shown in FIG. 1A, source S2 of depletion-mode transistor 104 is connected to drain D1 of enhancement-mode transistor 102. Gate G2 of depletion-mode transistor 104 is connected to source S1 of enhancement-mode transistor 102 at node 108. Also shown in rectifier/switching circuit 100, diode 106 is in parallel with optional enhancement-mode transistor 102. FIG. 1A shows the anode of diode 106 connected to source S1 of enhancement-mode transistor 102 at node 110 and the cathode of diode 106 connected to drain D1 of enhancement-mode transistor 102 at node 112.

In the embodiment shown in FIG. 1A, rectifier/switching circuit 100 comprises voltage terminal 114, voltage terminal 116, and gate terminal 118 when enhancement-mode transistor 102 is present. Voltage terminal 114 is connected to voltage $V_X$ and voltage terminal 116 is connected to voltage $V_Y$.

In embodiments where optional enhancement-mode transistor 102 is not present, or where enhancement-mode transistor 102 is always OFF (e.g., $V_{G1}$ can be shorted to ground), rectifier/switching circuit 100 can be a rectifier circuit. Gate terminal 118, which comprises gate G1 of enhancement-mode transistor 102, is connected to gate voltage $V_{G1}$ and can be used to modulate the current through rectifier/switching circuit 100 when present.

In the present embodiment, depletion-mode transistor 104 can comprise a high voltage transistor. For example, according to various embodiments, depletion-mode transistor 104 typically has a breakdown voltage of over 100 volts (for example from 100 to 1200 volts). In some embodiments, depletion-mode transistor 104 can comprise, for example, a high electron mobility transistor (HEMT), such as a group III-V HEMT.

As used herein, the phrase "III-Nitride or III-N" refers to a compound semiconductor that includes nitrogen and at least one group three element including Al, Ga, In and B, and including but not limited to any of its alloys, such as aluminum gallium nitride (AlxGa(1−x)N), indium gallium nitride (InyGa(1−y)N), aluminum indium gallium nitride (AlxInyGa(1−x−y)N), gallium arsenide phosphide nitride (GaAsaPbN(1−a−b)), aluminum indium gallium arsenide phosphide nitride (AlxInyGa(1−x−y)AsaPbN(1−a−b)), amongst others. III-nitride material also refers generally to any polarity including but not limited to Ga-polar, N-polar, semi-polar or non-polar crystal orientations. The III-Nitride material is also includes either the Wurtzitic, Zincblende or mixed polytypes, and includes single-crystal, monocrystal, polycrystal or amorphous crystal structures.

As an example, depletion-mode transistor 104 can be a III-N HEMT. Also in the present embodiment, as examples, diode 106 can comprise a silicon Schottky, a PN junction diode or a III-N diode. In a preferred embodiment, diode 106 is a Schottky diode. In some embodiments, diode 106 can comprise the body diode of a transistor. For example, diode 106 can comprise a PN junction diode of optional enhancement-mode transistor 102. Diode 106 can comprise the body diode of a low to medium voltage transistor. For example, according to various embodiments, diode 106 can have a breakdown voltage in the range of 1 to 50 volts.

When present, enhancement-mode transistor 102 can comprise a low to medium voltage transistor. For example, according to various embodiments, enhancement-mode transistor 102 can have a breakdown voltage in the range of 1 to 50 volts. In some embodiments, enhancement-mode transistor 102 can comprise, for example, a field-effect transistor (FET), such as a silicon FET.

In accordance with an embodiment of the present invention, rectifier/switching circuit 100 includes current source 120, which can improve stability of rectifier/switching circuit 100. As shown in FIG. 1A, in the present embodiment, current source 120 is in parallel with depletion-mode transistor 104. FIG. 1A shows current source 120 connected to source S2 of depletion-mode transistor 104 at node 122 and to drain D2 of depletion-mode transistor 104 at node 124. In some embodiments current source 120 may not be in parallel with depletion-mode transistor 104 as shown in FIG. 1A, but may, for example, still be connected to node 122.

Current source 120 is configured to supply pre-determined current $I_C$ to a cathode of diode 106 when rectifier/switching circuit 100 is in reverse blocking mode. In some embodiments pre-determined current $I_C$ is greater than transistor leakage current $I_T$ of depletion-mode transistor 104. Pre-determined current $I_C$ can provide a clamp before voltage $V_{G2S2}$ (i.e. the voltage between $V_{G2}$ and $V_{S2}$) begins to approach the pinch-off voltage of the depletion-mode transistor and subsequently may damage the depletion-mode transistor 104, thereby improving stability of rectifier/switching circuit 100. Pre-determined current $I_C$ can be, for example, from 100 microamps to 2 milliamps, however, if pre-determined current $I_C$ is too large, rectifier/switching circuit 100 will dissipate too much power. In some embodiments, current source 120 is a voltage controlled current source. For example, current source 120 can be controlled by voltage $V_{G2S2}$.

To illustrate exemplary operation of rectifier/switching circuit 100, let us assume, for this example, that enhancement-mode transistor 102 has a threshold voltage of 5 volts and depletion-mode transistor 104 has a pinch off voltage (i.e. a threshold voltage) of −4 volts.

As stated above, in embodiments where enhancement-mode transistor 102 is not present, or where enhancement-mode transistor 102 is always OFF (e.g., $V_{G1}$ can be shorted to ground), rectifier/switching circuit 100 can be a rectifier circuit. In such embodiments, when voltage $V_X$ is greater than voltage $V_Y$, rectifier/switching circuit 100 can function similar to a forward biased diode as $V_{G2S2}$ (i.e. the voltage between $V_{G2}$ and $V_{S2}$) will correspond to the forward voltage drop of diode 106 such that depletion-mode transistor 104 is ON. However, when voltage $V_X$ is a low voltage, such as ground, and voltage $V_Y$ is a high voltage, such as 600 volts, $V_{S2}$ can be, for example, 10 volts and $V_{G2}$ can be 0 volts so that voltage $V_{G2S2}$ is −10 volts and depletion-mode transistor 104 is OFF. Thus, rectifier/switching circuit 100 is OFF and is functioning similar to a diode in reverse blocking mode.

Figure 1B:
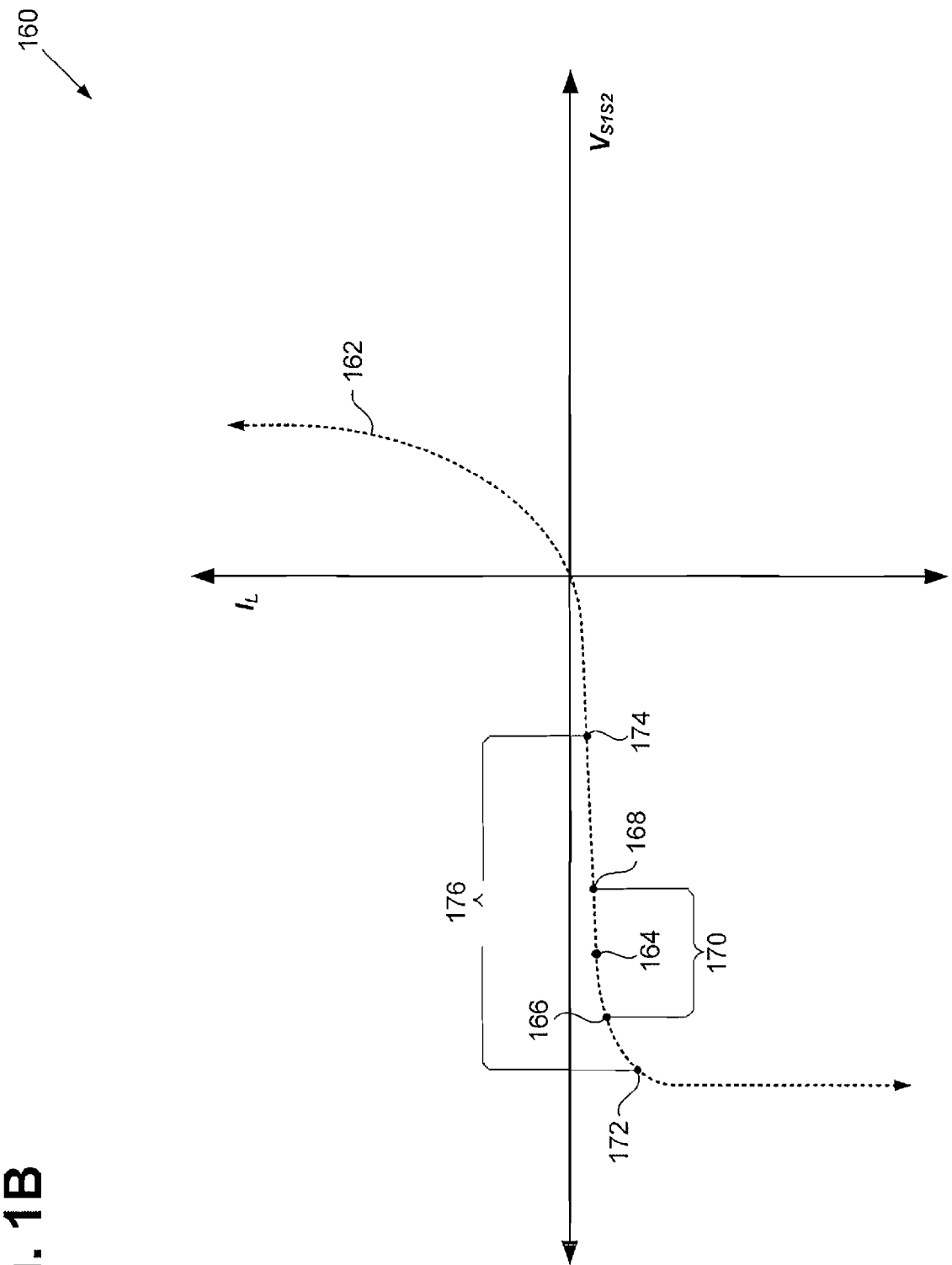
FIG. 1B shows a graph including an I-V curve of a diode in accordance with one embodiment of the present invention.

In reverse blocking mode, diode 106 has leakage current $I_L$, which can cause instability in rectifier/switching circuit 100. Referring now to FIG. 1B, FIG. 1B shows graph 160 including I-V curve 162 of diode 106. I-V curve 162 has X-axis $V_{S1S2}$ (i.e. the voltage between $V_{S1}$ and $V_{S2}$ in FIG. 1A) and Y-axis diode leakage current $I_L$. Point 164 in graph 160 corresponds with $V_{S1S2}$ being equal to −10 volts. Thus, in the present example, the parallel connection of current source 120 and depletion-mode transistor 104 is in series with diode 106. To clamp $V_{G2S2}$ at −10 volts, the current in rectifier/switching circuit 100 should satisfy the relationship that transistor leakage current $I_T$+pre-determined current $I_C$=diode leakage current $I_L$.

Depletion-mode transistor 104, which in this example is a III-N HEMT, can only leak 10 to 1000 nanoamps when OFF. Thus, it can be difficult to design depletion-mode transistor 104 to completely support diode leakage current $I_L$. Furthermore, graph 160 shows depletion-mode transistor 104 alone can only support diode leakage current $I_L$ over a limited range of current values between current values 166 and 168, which is indicated by current range 170. However, during operation of rectifier/switching circuit 100, I-V curve 162 can change. For example, diode leakage current $I_L$ can become more negative for a same $V_{S1S2}$ value as diode 106 leaks more current, for example, due to becoming heated. Thus, diode leakage current $I_L$ can easily fall outside of current range 170, which is narrow.

Without current source 120, as diode leakage current $I_L$ increases beyond current value 166, voltage $V_{G2S2}$ of depletion-mode transistor 104 will adjust so as to attempt to supply increased leakage current $I_T$ to support diode leakage current $I_L$, thereby resulting in circuit instability. For example, voltage $V_{G2S2}$ can approach the pinch-off voltage of D-mode transistor 104 as leakage current $I_L$ increases in magnitude. As voltage $V_{G2S2}$ approaches pinch off voltage, rectifier/switching circuit 100 can easily become damaged. For example, the gate dielectric of depletion-mode transistor 104 may rupture and become leaky due to a high electric field.

However, current source 120 and depletion-mode transistor 104 together can support diode leakage current $I_L$ over a range of current values between current values 172 and 174 indicated by current range 176, which is much larger than current range 170. As such, current source 120 can provide a clamp before voltage $V_{G2S2}$ begins to approach the pinch-off voltage of depletion-mode transistor 104 and can protect against voltage $V_{G2S2}$ reaching a point, for example, where a high electric field may damage depletion-mode transistor 104, thereby improving stability of rectifier/switching circuit 100.

In embodiments where enhancement-mode transistor 102 is present, rectifier/switching circuit 100 can be an enhancement-mode switching circuit. For example, rectifier/switching circuit 100 can be similar to an enhancement-mode transistor with voltage terminal 114 corresponding to a source terminal and voltage terminal 116 corresponding to a drain terminal. In such embodiments, voltage $V_X$ can be at low voltage, such as ground, and voltage $V_Y$ can be at a high voltage, such as 600 volts. When $V_{G1}$ is above, for example, 5 volts, enhancement-mode transistor 102 can be ON so that $V_{G2S2}$ will correspond to the parallel combination of the forward voltage drop of diode 106 and enhancement-mode transistor 102, such that depletion-mode transistor 104 is ON. Thus, rectifier/switching circuit 100 is ON and is functioning similar to an enhancement-mode switch in forward conduction anode. However, when $V_{G1}$ is around 0 volts, enhancement-mode transistor 102 can be OFF, $V_{S2}$ can be, for example, 10 volts and $V_{G2}$ can be 0 volts so that voltage $V_{G2S2}$ is −10 volts and depletion-mode transistor 104 is OFF. Thus, rectifier/switching circuit 100 is OFF and is functioning similar to an enhancement-mode switch in reverse blocking mode.

In reverse blocking mode, diode 106 still has leakage current $I_L$, which can cause instability in rectifier/switching circuit 100; similar to what has been described above with regard to rectifier/switching circuit 100 as a rectifier circuit. Thus, current source 120 and depletion-mode transistor 104 together can similarly support diode leakage current $I_L$ over current range 176, which is much larger than current range 170. It is noted that in the exemplary embodiments discussed in the present application, a leakage current of enhancement-mode transistor 102 is presumed to be very small for simplicity of description, for example, less than transistor leakage current $I_T$ or not present.

Figure 2:
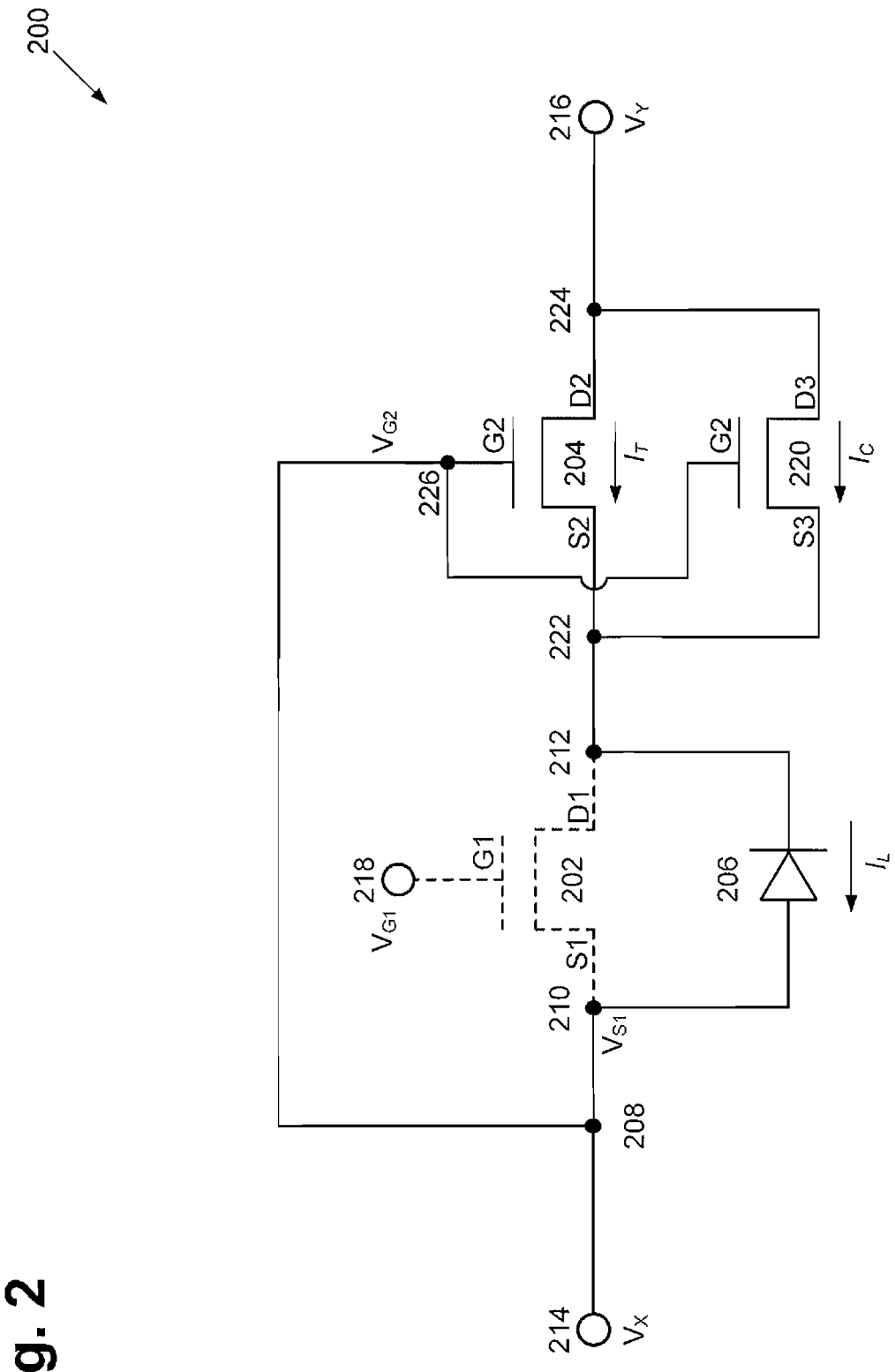
FIG. 2 illustrates a circuit diagram of an exemplary rectifier/switching circuit in accordance with one embodiment of the present invention.

Referring now to FIG. 2, FIG. 2 illustrates a circuit diagram of exemplary rectifier/switching circuit 200 in accordance with one embodiment of the present invention. Rectifier/switching circuit 200 corresponds to rectifier/switching circuit 100 in FIG. 1A. For example, enhancement-mode transistor 202, depletion-mode transistor 204, and diode 206 correspond respectively to enhancement-mode transistor 102, depletion-mode transistor 104, and diode 106 in FIG. 1A. Thus, in some embodiments, enhancement-mode transistor 202 is similarly optional in rectifier/switching circuit 200. Furthermore, in FIG. 2, nodes 208, 210, 212, 222, and 224 can correspond respectively to nodes 108, 110, 112, 122, and 124 in FIG. 1A and voltage terminal 214, voltage terminal 216, and control terminal 218 can correspond respectively to voltage terminal 114, voltage terminal 116, and gate terminal 118 in FIG. 1A.

Rectifier/switching circuit 200 also includes at least another depletion-mode transistor, which corresponds to current source 120 in FIG. 1A. More particularly, rectifier/switching circuit 200 includes depletion-mode transistor 204, which can correspond to current source 120 in FIG. 1A. In the present embodiment, depletion-mode transistor 220 is in parallel with depletion-mode transistor 204. As shown in FIG. 2, source S3 of depletion-mode transistor 220 connected to source S2 of depletion-mode transistor 204 at node 222 and drain D3 of depletion-mode transistor 220 is connected to drain D2 of depletion-mode transistor 204 at node 224. Furthermore, gate G3 of depletion-mode transistor 220 is connected to gate G2 of depletion-mode transistor 204 at node 226.

Depletion-mode transistor 220 is configured to supply pre-determined current $I_C$ to a cathode of diode 206. In some embodiments pre-determined current $I_C$ may be greater than leakage current $I_T$ of depletion-mode transistor 204. In the present embodiment, depletion-mode transistor 220 is a voltage controlled current source. Also in the present embodiment, depletion-mode transistor 220 has a more negative pinch off voltage than depletion-mode transistor 204. For example, in one embodiment, depletion-mode transistor 204 can have a pinch off voltage of −4 volts and depletion-mode transistor 220 can have a pinch off voltage of −15 volts. Thus, in some embodiments, depletion-mode transistor 220 can be configured to remain ON whether rectifier/switching circuit 200 is ON or OFF, for example, depletion-mode transistor 220 can be configured to remain ON to supply pre-determined current $I_C$ while depletion-mode transistor 204 is OFF. As an example, voltage $V_{G2S2}$ may be −10 volts when $V_{G1}$ of enhancement-mode transistor 202 is 0 volts. In other embodiments, depletion-mode transistor 220 can be configured to remain OFF and still supply pre-determined current $I_C$ while depletion-mode transistor 204 is OFF due to having a more negative pinch off voltage. So long as the sum of transistor leakage current $I_T$ and pre-determined current $I_C$ is greater than diode leakage current $I_L$, voltage $V_{G2S2}$ can be clamped at or near −15 volts, thereby improving stability of rectifier/switching circuit 200.

Depletion-mode transistor 220 can be configured to have a more negative pinch off voltage than depletion-mode transistor 204 using any suitable method. In one embodiment, for example, depletion-mode transistor 220 can have a more negative pinch off voltage than depletion-mode transistor 204 by having a thicker gate dielectric. In other embodiments, depletion-mode transistor 220 can have a more negative pinch off voltage than depletion-mode transistor 204 by having a gate dielectric with a higher dielectric constant than a gate dielectric of depletion-mode transistor 204.

Figure 3:
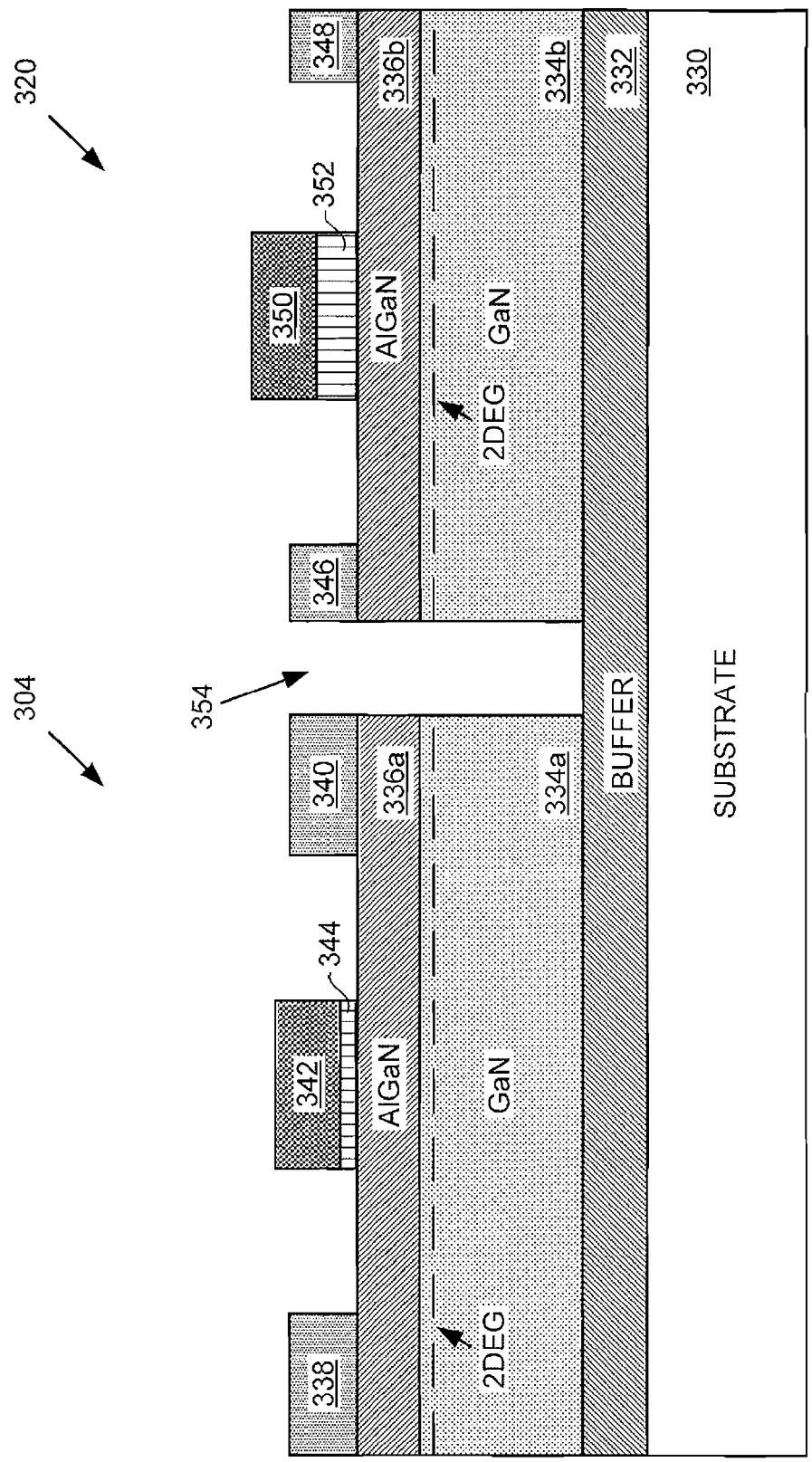
FIG. 3 illustrates exemplary monolithically formed depletion-mode transistors in accordance with one embodiment of the present invention.

In some embodiments, depletion-mode transistors 220 and 204 can be monolithically formed over a common substrate, for example a silicon, SOI (silicon on insulator), sapphire, or silicon carbide substrate. In other embodiments, depletion-mode transistors 220 and 204, and enhancement-mode transistor 202 and diode 206 can all be monolithically formed on a common substrate, for example a silicon, SOI, sapphire, or silicon carbide substrate. Referring now to FIG. 3, FIG. 3 illustrates exemplary monolithically formed depletion-mode transistors 304 and 320, in accordance with one embodiment of the present invention. Depletion-mode transistors 304 and 320 can correspond respectively to depletion-mode transistors 204 and 220 in FIG. 2. In the present embodiment, depletion-mode transistors 304 and 320 are each III-Nitride high electron mobility transistors (HEMTs). In other embodiments depletion-mode transistors 304 and 320 can each comprise, for example, group III-V HEMTs, a group III-V FET, or other depletion-mode transistors not specifically discussed herein. As shown in FIG. 3, depletion-mode transistors 304 and 320 have a common substrate 330. Substrate 330 can be any suitable substrate and can comprise, for example silicon, SOI, sapphire, and silicon carbide.

Also shown in FIG. 3, depletion-mode transistors 304 and 320 further include a common buffer layer 332. Buffer layer 332 can comprise any suitable buffer material, for example, in one embodiment buffer layer 332 can comprise an aluminum nitride (AlN) layer. Also, depletion-mode transistors 304 and 320 can optionally include one or more common transition layers. For example, depletion-mode transistors 304 and 320 can include aluminum gallium nitride (AlGaN) transition layers formed over an AlN buffer layer with varying amounts of aluminum concentration. Furthermore, the aluminum concentration of the transition layers can be higher closer to buffer layer 332 and lower closer to GaN layers 334a and 334b.

Also shown in FIG. 3, gallium nitride (GaN) layers 334a and 334b are formed over buffer layer 332 (or over the optional transition layers in some embodiments). Furthermore, relatively thin AlGaN barrier layers 336a and 336b are formed respectively over GaN layers 334a and 334b. At the interface of AlGaN layer 336a and GaN layer 334a and at the interface of AlGaN barrier layer 336b and GaN layer 334b two-dimensional electron gas (2DEG) layer is created, as is known in the art.

In one embodiment, the increased negative pinch off voltage of depletion-mode transistor 320 is achieved through the use of a thicker gate dielectric 352 and/or a thicker barrier layer 336b compared to the thickness of gate dielectric 344 and the thickness of barrier layer 336a in transistor 304.

In another embodiment, III-N transistor 304 may include a Schottky gate. In this embodiment, gate electrode 342 is a metal gate and is formed directly on the III-N barrier layer 336a and does not include gate dielectric layer 344 between gate electrode 342 and barrier layer 336a.

Although some embodiments of the present invention do not require isolation, the embodiment shown in FIG. 3 utilizes an isolation trench 354 to isolate depletion-mode transistors 304 and 320 and, in particular, to isolate the 2DEG between depletion-mode transistors 304 and 320, although other isolation means can be used. In some embodiments the use of an isolation trench or other means of isolation is not preferred and depletion-mode transistors 304 and 320 are not isolated. In the present embodiment isolation trench 354 extends through GaN layers 334a and 334b and AlGaN layers 336a and 336b and reaches buffer layer 332. In some embodiments, GaN layers 334a and 334b can be formed from a common GaN layer and AlGaN layers 336a and 336b can be formed from a common AlGaN layer and isolation trench 354 can be extended through the common GaN and AlGaN layers to form GaN layers 334a and 334b and AlGaN layers 336a and 336b.

In the present example, depletion-mode transistor 304 includes source electrode 340, drain electrode 338, and gate electrode 342 formed over gate dielectric 344. Depletion-mode transistor 320 includes source electrode 346, drain electrode 348, and gate electrode 350 formed over gate dielectric 352. In the present embodiment, respective distances between drain electrode 338 and gate electrode 342, gate electrode 342 and source electrode 340, drain electrode 346 and gate electrode 350, and gate electrode 350 and source electrode 348 are substantially equal. In other embodiments these distances can be different from one another. Also, while FIG. 3 shows insulated gates, the depletion-mode transistors 304 and 320 do not have to have insulated gates. For example, in other embodiments the gates can be Schottky gates.

Although not shown in FIG. 3, respective source electrodes 340 and 346, respective drain electrodes 338 and 348 and respective gate electrodes 342 and 350 are electrically connected so that depletion-mode transistors 304 and 320 are connected in parallel similar to depletion-mode transistors 204 and 220 in FIG. 2.

In the present example, depletion-mode transistor 320 is configured to have a pinch off voltage larger in magnitude than depletion-mode transistor 304. For example, in the present embodiment depletion-mode transistor 320 has a pinch off voltage of −15 volts while depletion-mode transistor 304 has a pinch off voltage of −4 volts.

In some embodiments, depletion-mode transistors 320 and 304 can have approximately the same on-state saturation current per unit area. Thus, depletion-mode transistor 320 can have a different pinch off voltage than depletion-mode transistor 304, for example, because gate dielectric 352 of depletion-mode transistor 320 is thicker than gate dielectric 344 of depletion-mode transistor 320. As an example, gate dielectric 352 can be about 3 to 4 times thicker than gate dielectric 344. Thus, at the same gate-source voltage, transistor 304 conducts more current relative to transistor 320. In one embodiment, gate dielectric 352 can be approximately 1000 to 2000 Angstroms thick silicon nitride (SiN), and gate dielectric 344 can be approximately 100 to 400 Angstroms thick SiN.

As used herein, the term "silicon nitride (SiN)" refers to a compound that includes silicon and at least nitrogen. It may take on the specific stoichiometric form of $Si_3N_4$ or of any number of stoichiometric forms described as $Si_xN_y$, or may be the non-stoichiometric form generally described as $SiN_x$. It also includes but is not limited to any of its alloys including Silicon-Oxynitride, AlSiN, AlN, SiCN or any other silicon nitride based compound. The oxygen and nitrogen content may be altered for example by ex-situ through diffusion, oxidation, and/or nitridation. Additionally, a layer of SiN may be comprised of a single layer, or two or more layers with each layer comprising a form of SiN. The layers may be doped in-situ as deposited, doped ex-situ through ion implantation, diffusion or other means, or may be undoped.

Although in the present embodiment gate dielectrics 352 and 344 both comprise SiN, in other embodiments gate dielectrics 352 and 344 can comprise different dielectric materials. Also in some embodiments, gate dielectrics 352 and 344 may have any thickness including the same thickness and can each comprise multiple dielectric layers. Furthermore, it will be appreciated that in accordance with various embodiments, depletion-mode transistor 320 can be made to have a larger magnitude pinch off voltage than depletion-mode transistor 304 using any suitable means.

In some embodiments, depletion-mode transistor 304 has a larger gate periphery than depletion-mode transistor 320, i.e. transistor 304 is larger and conducts greater current than transistor 320. For example, depletion-mode transistor 320 can have a gate periphery between 5% of the gate periphery and 0.1% of the gate periphery of the depletion-mode transistor 304. It is noted that depletion-mode transistors 304 and 320 are not drawn to scale in FIG. 3. If the gate periphery of depletion-mode transistor 320 is too large, voltage $V_{G2S2}$ in FIG. 2 can become a more negative value in an attempt to compensate for excessive pre-determined current $I_C$ and may damage rectifier/switching circuit 200.

In some embodiments, each of depletion-mode transistors 320 and 304 can comprise a plurality of transistor cells connected in parallel. According to one embodiment, each transistor cell can support approximately the same amount of current, for example, 100 milliamps. Depletion-mode transistor 320 can be made to have a gate periphery smaller than the gate periphery of depletion-mode transistor 304, by varying the number of transistor cells in each of depletion-mode transistor 320 as compared to depletion-mode transistor 304. For example, depletion-mode transistor 320 can have approximately 0.1% to 5% of the transistor cells of depletion-mode transistor 304.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A rectifier circuit comprising:
a diode;
a first depletion-mode transistor connected to a cathode of said diode;
at least one second depletion-mode transistor in parallel with said first depletion-Mode transistor and configured to supply a pre-determined current to said cathode of said diode when said rectifier circuit is in reverse blocking mode;
wherein a sum of a leakage current of said first depletion-mode transistor and said pre-determined current of said at least one second depletion-mode transistor is greater than a leakage current of said diode in said reverse blocking mode.

2. The rectifier circuit of claim 1, wherein a pinch off voltage of said at least one second depletion-mode transistor is more negative than a pinch off voltage of said first depletion-mode transistor.

3. The rectifier circuit of claim 1, wherein said at least one second depletion-mode transistor is configured to supply said pre-determined current while said first depletion-mode transistor is OFF.

4. The rectifier circuit of claim 1; wherein said pre-determined current is greater than said leakage current of said first depletion-mode transistor.

5. The rectifier circuit of claim 1, wherein said first depletion-mode transistor has a larger gate periphery than said at least one second depletion-mode transistor.

6. The rectifier circuit of claim 1, wherein said first depletion-mode transistor and said at least one second depletion-mode transistor have a common substrate.

7. The rectifier circuit of claim 6, wherein said common substrate comprises silicon.

8. The rectifier circuit of claim 1, wherein said first depletion-mode transistor, said at least one second depletion-mode transistor and said diode have a common substrate.

9. The rectifier circuit of claim 1, wherein said diode is in parallel with at least one enhancement-mode transistor.

10. The rectifier circuit of claim 1, wherein said diode is a body diode of an enhancement-mode transistor.

11. The rectifier circuit of claim 10, wherein said first depletion-mode transistor, said at least one second depletion-mode transistor, said diode and said enhancement-mode transistor have a common substrate.

12. The rectifier circuit of claim 1, wherein said diode is a Schottky diode.

13. The rectifier circuit of claim 1, wherein said diode is a PN junction diode.

14. The rectifier circuit of claim 1, wherein said first depletion-mode transistor comprises a Schottky gate.

15. The rectifier circuit of claim 1, wherein said first depletion-mode transistor and said at least one second depletion-mode transistors have respective first gate dielectric thickness and second gate dielectric thickness.

16. The rectifier circuit of claim 1, wherein said first depletion-mode transistor and said at least one second depletion-mode transistors have respective first barrier layer thickness and second barrier layer thickness.

17. The rectifier circuit of claim 1, wherein said first depletion-mode transistor is isolated from said at least one second depletion-mode transistor.

18. The rectifier circuit of claim 1, wherein said first depletion-mode transistor and said at least one second depletion-mode transistor comprise III-nitride high electron mobility transistors.

* * * * *